(12) United States Patent
Lim et al.

(10) Patent No.: US 8,004,249 B2
(45) Date of Patent: Aug. 23, 2011

(54) BATTERY MANAGEMENT SYSTEM AND METHOD

(75) Inventors: Gye-Jong Lim, Suwon-si (KR); Han-Seok Yun, Suwon-si (KR); Se-Wook Seo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 208 days.

(21) Appl. No.: 11/643,219

(22) Filed: Dec. 19, 2006

(65) Prior Publication Data

US 2007/0139007 A1 Jun. 21, 2007

(30) Foreign Application Priority Data

Dec. 19, 2005 (KR) .................. 10-2005-0125240

(51) Int. Cl.
*H02J 7/00* (2006.01)
*G01N 27/416* (2006.01)

(52) U.S. Cl. ........ 320/166; 320/167; 320/116; 320/118; 324/428; 324/429; 324/431

(58) Field of Classification Search .................. 320/166, 320/116, 118; 324/428, 429, 431
See application file for complete search history.

(56) References Cited

U.S. PATENT DOCUMENTS

| | | | | |
|---|---|---|---|---|
| 5,712,568 | A * | 1/1998 | Flohr et al. ..................... | 324/434 |
| 6,157,165 | A * | 12/2000 | Kinoshita et al. ............. | 320/116 |
| 6,268,710 | B1 | 7/2001 | Koga | |
| 6,362,627 | B1 * | 3/2002 | Shimamoto et al. .......... | 324/434 |
| 6,563,291 | B2 | 5/2003 | Tamura et al. | |
| 6,608,482 | B2 * | 8/2003 | Sakai et al. ................... | 324/426 |
| 6,639,408 | B2 * | 10/2003 | Yudahira et al. ............. | 324/434 |
| 7,453,232 | B2 * | 11/2008 | Furukawa ..................... | 320/104 |
| 2002/0000789 | A1 * | 1/2002 | Haba ............................. | 320/128 |
| 2003/0189419 | A1 * | 10/2003 | Maki et al. .................... | 320/166 |

FOREIGN PATENT DOCUMENTS

| | | |
|---|---|---|
| EP | 0 990 913 A1 | 4/2000 |
| GB | 2 169 720 A | 7/1986 |
| JP | 2001-201522 | 7/2001 |
| JP | 2002-042906 | 2/2002 |
| JP | 2002-354697 | 12/2002 |
| JP | 2003-114243 | 4/2003 |

OTHER PUBLICATIONS

European Search Report dated Oct. 16, 2007, for EP 06126328.1, which corresponds to priority application KR 10-2005-0125240, in the name of Samsung SDI Co., Ltd.

(Continued)

*Primary Examiner* — Edward Tso
*Assistant Examiner* — Ahmed Omar
(74) *Attorney, Agent, or Firm* — Christie, Parker & Hale, LLP

(57) ABSTRACT

A battery management system is provided. A voltage of a first battery cell is charged to a capacitor. Then, the voltage of the capacitor is measured, the measured voltage being the voltage of the first battery cell. Subsequently, a voltage of a second battery cell is again charged to the capacitor while the capacitor holds the voltage of the first battery cell. The voltage of the capacitor is then measured, the measured voltage being the voltage of the second battery cell. With such a scheme, the time for discharging the capacitor may be removed, and accordingly, a period for measuring a voltage of the battery cell may become shorter.

26 Claims, 10 Drawing Sheets

OTHER PUBLICATIONS

Patent Abstracts of Japan, Publication No. 2001-201522; Date of Publication: Jul. 27, 2001; in the name of Masaru Noda.

Patent Abstracts of Japan, Publication No. 2002-354697; Date of Publication: Dec. 6, 2002; in the name of Akihito Hayano et al.

Patent Abstracts of Japan, Publication No. 2003-114243; Date of Publication: Apr. 18, 2003; in the name of Tetsuya Kobayashi et al.

* cited by examiner

BATTERY MANAGEMENT SYSTEM AND METHOD

CROSS-REFERENCE TO RELATED APPLICATION

This application claims priority to and the benefit of Korean Patent Application No. 10-2005-0125240 filed in the Korean Intellectual Property Office on Dec. 19, 2005, the entire contents of which are incorporated herein by reference.

BACKGROUND OF THE INVENTION

1. Field of the Invention

The present invention relates to a battery management system and a battery management method. More particularly, the present invention relates to a battery management system of a vehicle utilizing electrical energy.

2. Description of the Related Art

Recently, vehicles such as an electric vehicle and a hybrid vehicle have been developed to replace vehicles using only an internal combustion engine. The electric vehicle uses an engine operated by the electrical energy of a battery, and the hybrid vehicle uses two or more power sources together, such as a battery engine and an internal combustion engine.

Since the battery engine mainly utilizes a battery formed of multiple rechargeable/dischargeable battery cells, recharge/discharge levels of the battery cells affect operation of the battery engine. For example, when the charging amount of the battery cell is lower than a target amount, the supplied voltage is too low such that the battery engine may not be operated normally. When the charged amount of the battery cell is higher than the target amount, the supplied voltage is too high such that a driving circuit may be damaged.

Also, since the typical battery is formed with multiple battery cells and sensing systems for sensing the charging and discharging of the battery cells are provided at the respective battery cells when multiple battery cells are separately managed.

SUMMARY OF THE INVENTION

In accordance with the present invention a battery management system is provided for managing the charging and discharging of a plurality of battery cells.

An exemplary embodiment of the present invention provides a system for managing a battery having a plurality of battery cells coupled in series, the plurality of battery cells including a first battery cell and a second battery cell. The system includes a first relay, a second relay, a first voltage transmitting unit, a charging unit, a second voltage transmitting unit, and a control signal generator. A first relay has first relay input terminals and first relay output terminals. The first relay input terminals are respectively coupled to a first battery cell anode and to a first battery cell cathode. The first relay is configured to operate in response to a first control signal. A second relay has second relay input terminals and second relay output terminals. The second relay input terminals are respectively coupled to a second battery cell anode and to a second battery cell cathode. The second relay is configured to operate in response to a second control signal. A first voltage transmitting unit has first voltage transmitting unit input terminals and a first voltage transmitting unit output terminal. The first voltage transmitting unit input terminals are respectively coupled to the first relay output terminals and the second relay output terminals. The first voltage transmitting unit is configured to output a voltage from the first voltage transmitting unit input terminals in response to an on-voltage of a third control signal. A charging unit has a charging unit input terminal and a charging unit output terminal. The charging unit input terminal is coupled to the first voltage transmitting unit output terminal. The charging unit is configured to be charged to a voltage by the first voltage transmitting unit output terminal. A second voltage transmitting unit has a second voltage transmitting unit input terminal and a second voltage transmitting unit output terminal. The second voltage transmitting unit input terminal is coupled to the charging unit output terminal. The second voltage transmitting unit is configured to output a voltage of the charging unit in response to an on-voltage of a fourth control signal. A control signal generator is configured to set the voltage of the charging unit as a voltage of the second battery cell by setting the second control signal as an on-voltage while the voltage of the charging unit corresponds to a voltage of the first battery cell.

The control signal generator may be further configured to set the first and third control signals as an on-voltage and the second and fourth control signals as an off-voltage during a first period, set the fourth control signal as an on-voltage and the first, second, and third control signals as an off-voltage during a second period next to the first period, set the second and third control signals as an on-voltage and the first and fourth control signals as an off-voltage during a third period next to the second period, and set the fourth control signal as an on-voltage, and the first, second, and third control signals as an off-voltage during a fourth period next to the third period.

The charging unit may include at least one capacitor.

In addition, the fourth control signal may have an inverse voltage with respect to the third control signal.

Another embodiment of the present invention provides a method for managing a battery including a plurality of battery cells coupled in series, the plurality of battery cells including a first battery cell and a second battery cell. The method includes charging a capacitor with a first battery cell voltage, measuring the first battery cell voltage using the voltage charged to the capacitor corresponding to the first battery cell voltage, charging the capacitor with a second battery cell voltage under the condition that the capacitor is charged with the first battery cell voltage, and measuring the second battery cell voltage using the voltage charged to the capacitor corresponding to the second battery cell voltage.

Yet another embodiment provides a system for managing a battery having a plurality of battery cells, the plurality of battery cells being divided into a plurality of cell groups. The system includes a plurality of cell voltage measurers respectively coupled to the plurality of cell groups. An analog/digital converter is configured to convert voltages measured by the plurality of cell voltage measurers into digital signals. A controller is configured to control charging and discharging of the plurality of battery cells included in each of the cell groups according to the digital signals converted by the analog/digital converter. Each of the cell voltage measurers includes a capacitor and is configured to charge a voltage of a first battery cell among the plurality of battery cells of a corresponding one of the cell groups to the capacitor; transmit a voltage charged to the capacitor by the first battery cell to the analog/digital converter; charge a voltage of a second battery cell among the plurality of battery cells of a corresponding one of the cell groups to the capacitor while the voltage of the first battery cell is held in the capacitor; and transmit a voltage charged to the capacitor by the second battery cell to the analog/digital converter.

In yet another embodiment, a battery system is provided. The battery system includes a battery having a plurality of battery cells coupled in series. The plurality of battery cells includes a first battery cell and a second battery cell. In addition, the battery system includes a battery management system. The battery management system includes a cell voltage measurer configured to measure a capacitor voltage charged to a capacitor after the capacitor is charged by the first battery cell, and measure the capacitor voltage after the capacitor is charged by the second battery cell, the capacitor being charged by the second battery cell while the capacitor holds a capacitor voltage equal to the first battery voltage.

In accordance with yet another embodiment of the present invention, electrical energy may be transmitted from the battery of the battery system to operate a power generator of a vehicle.

DETAILED DESCRIPTION OF THE EMBODIMENTS

Figure 1:
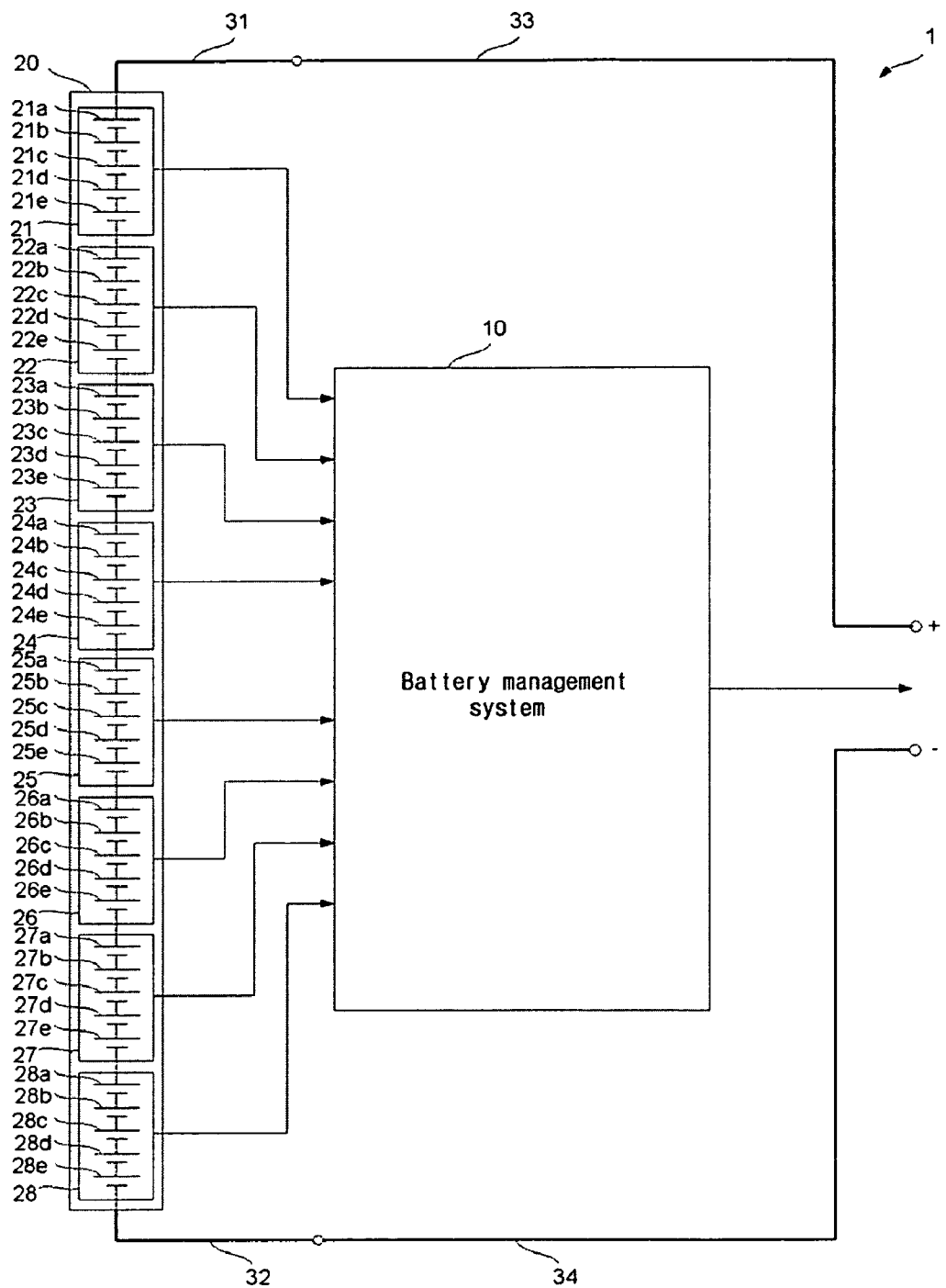
FIG. 1 schematically illustrates a battery system according to a first embodiment of the present invention.

Referring now to FIG. 1, the battery system 1 according to the first exemplary embodiment of the present invention includes a battery management system 10 and a battery 20.

The battery 20 includes a plurality of rechargeable/dischargeable battery cells 21a to 28e coupled in series with each other. In FIG. 1, for convenience of description, 40 numbered battery cells 21a to 28e are illustrated with the 40 battery cells 21a to 28e divided into 8 numbered cell groups 21 to 28. Two output terminals 31, 32 are respectively coupled to the battery cells 21a, 28e located at both ends among the plurality of battery cells 21a to 28e. In more detail, an anode output terminal 31 is coupled to an anode of the battery cell 21a, and a cathode output terminal 32 is coupled to a cathode of the battery cell 28e. Such anode and cathode output terminals 31, 32 are respectively coupled to anode and cathode input terminals 33, 34 of a power generator (not shown) of a vehicle, and accordingly, electrical energy of the battery 20 is supplied to the power generator.

The battery management system 10 measures voltages of the plurality of battery cells 21a to 28e, determines whether the battery cells 21a to 28e are over-charged or low-charged, and then controls the charging/discharging of the battery cells.

Figure 2:
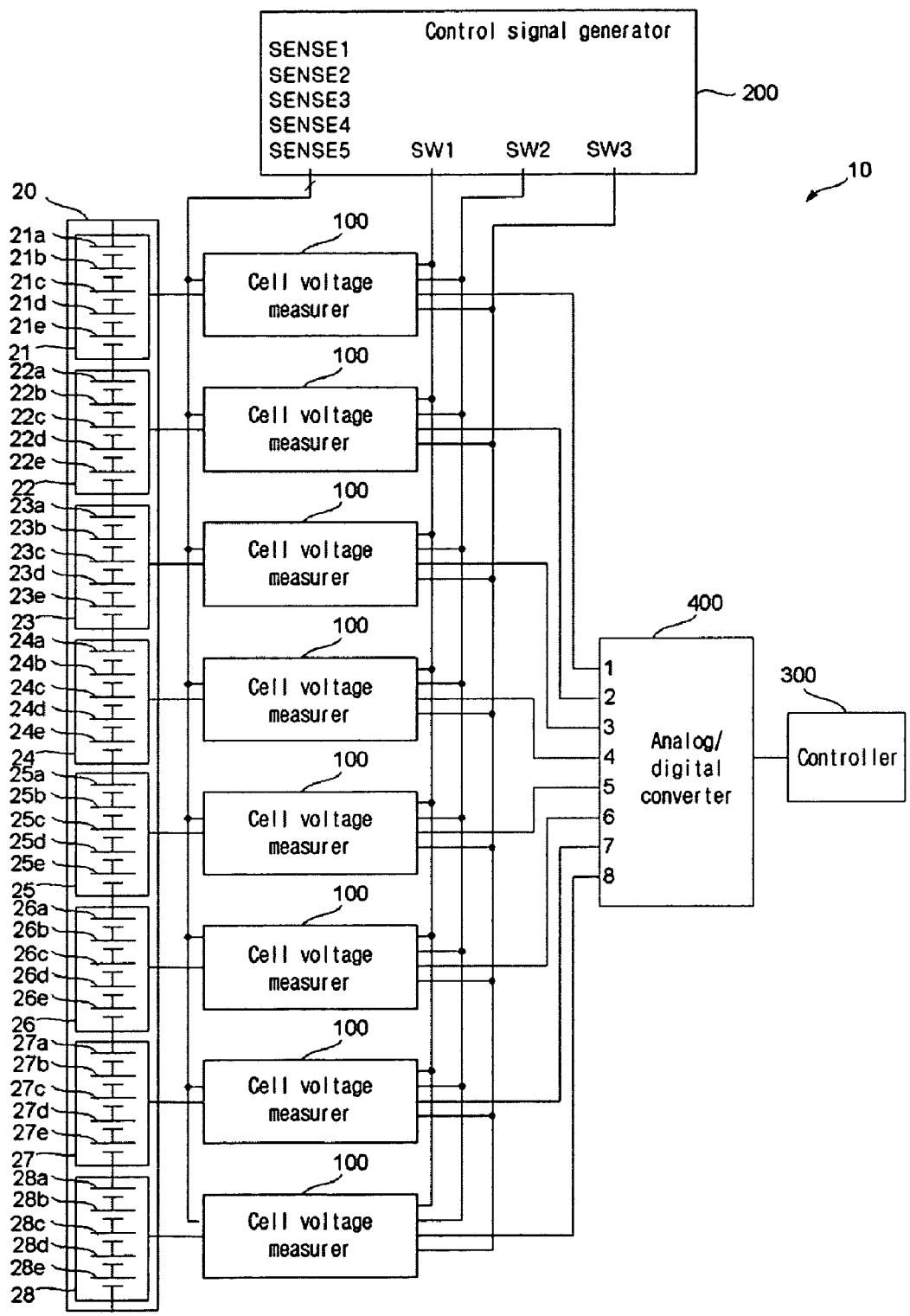
FIG. 2 schematically illustrates a battery management system of FIG. 1.
Figure 3:
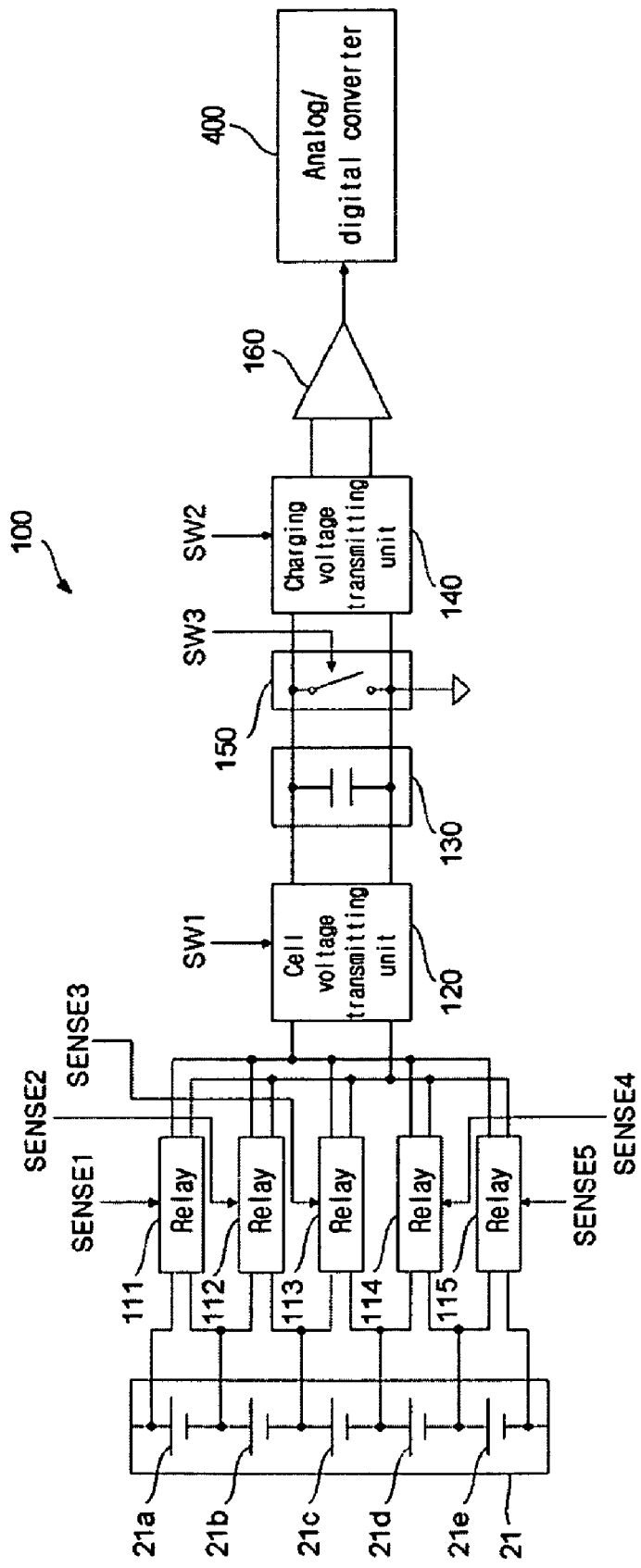
FIG. 3 schematically illustrates a cell voltage measurer of FIG. 2.

The battery management system 10 will be described in detail with reference to FIG. 2 to FIG. 4. FIG. 2 schematically illustrates the battery management system 10 of FIG. 1, and FIG. 3 schematically illustrates a cell voltage measurer of FIG. 2. In FIG. 3, for convenience of the description, only the cell voltage measurer 100 coupled to the cell group 21 is illustrated.

As shown in FIG. 2 and FIG. 3, the battery management system 10 includes a plurality of cell voltage measurers 100, a control signal generator 200, and a controller 300. The respective cell voltage measurers 100 are formed in correspondence with the respective cell groups 21 to 28. Those skilled in the art will appreciate that in an alternative embodiment to the embodiment shown in FIG. 2, a single cell voltage measurer 100 may be formed in correspondence with the plurality of battery cells 21a to 28e.

The respective cell voltage measurers 100 shown in FIG. 2 respectively measure the voltages of the plurality of battery cells of the corresponding cell groups 21 to 28 and transmit the measured values to the controller 300. An analog/digital converter 400 is provided between the plurality of cell voltage measurers 100 and the controller 300 for converting the voltages measured by the cell voltage measurer 100 into digital signals and transmitting the converted values to the controller 300. In one embodiment, the controller 300 may receive analog voltages from the cell voltage measurer 100. In another embodiment, the cell voltage measurer 100 converts the measured voltages into digital signals and then transmits the digital signals to the controller 300.

The control signal generator 200 transmits control signals SENSE1 to SENSE5 and SW1 to SW3 to the plurality of cell voltage measurers 100 and controls the cell voltage measurers 100 such that the respective cell voltage measurers 100 sequentially measure voltages of the plurality of battery cells of the respective cell groups 21 to 28. The controller 300 controls the charging/discharging of the battery cells based on the voltages of the respective battery cells that are transmitted from the respective cell voltage measurers 100.

As shown in FIG. 3, each cell voltage measurer 100 includes a plurality of relays 111 to 115, a cell voltage transmitting unit 120, a charging unit 130, a charging voltage transmitting unit 140, and a discharging unit 150.

As a representative example, the plurality of relays 111 to 115 are coupled between the plurality of battery cells 21a to 21e of the cell group 21 and the cell voltage transmitting unit 120. In more detail, the relays 111 to 115 respectively have two input terminals and two output terminals, and the two input terminals are respectively coupled to an anode and a cathode of the respective battery cells 21a to 21e and the two output terminals are respectively coupled to two input terminals of the cell voltage transmitting unit 120. The respective relays 111 to 115 transmit the voltages of the corresponding battery cells 21a to 21e to the cell voltage transmitting unit 120 in response to an on-voltage of the corresponding control signals SENSE1 to SENSE5 of the control signal generator 200, and electrically disconnect the corresponding battery cells 21a to 21e and the cell voltage transmitting unit 120 in response to an off-voltage of the corresponding control signals SENSE1 to SENSE5.

The two output terminals of the cell voltage transmitting unit 120 are respectively coupled to two terminals of the charging unit 130. The cell voltage transmitting unit 120 provides the voltages transmitted from the battery cells 21a to 21e through the relays 111 to 115 to the charging unit 130 in response to an on-voltage of the control signal SW1 transmitted from the control signal generator 200. The cell voltage transmitting unit 120 prevents a leakage of the charged voltage of the charging unit 130 by electrically disconnecting the battery cells 21a to 21e and the charging unit 130 in response to an off-voltage of the control signal SW1.

One of the two terminals of the charging unit 130 is coupled to a reference voltage. The charging voltage transmitting unit 140 transmits the charged voltage of the charging unit 130 to the analog/digital converter 400 in response to an on-voltage of the control signal SW2. The discharging unit 150 includes a switch coupled between the two terminals of the charging unit 130, and discharges the voltage of the charging unit 130 by turning on the switch in response to an on-voltage of the control signal SW3.

The cell voltage measurer 100 further includes a buffer 160 coupled between the charging voltage transmitting unit 140 and the analog/digital converter 400. The buffer 160 prevents the voltage variance of the analog/digital converter 400 from affecting the charging voltage transmitting unit 140, such that the voltage of the charging voltage transmitting unit 140 may be normally transmitted to the analog/digital converter 400. Such a buffer 160 may include a voltage follower. In one embodiment, the voltage of the charging voltage transmitting unit 140 may be transmitted to the analog/digital converter 400 without the buffer 160.

The cell voltage transmitting unit 120 and the charging voltage transmitting unit 140 may be formed as a relay because they respectively function to transmit the voltages of the battery cells and the charging unit 130. The charging unit 130 may be formed as at least one capacitor such that it may be charged by the voltage of the battery cells.

Next, the operation of the cell voltage measurer 100 is described in more detail with reference to the timing diagram of FIG. 4 which shows control signals applied to a cell voltage measurer of FIG. 3.

Figure 4:
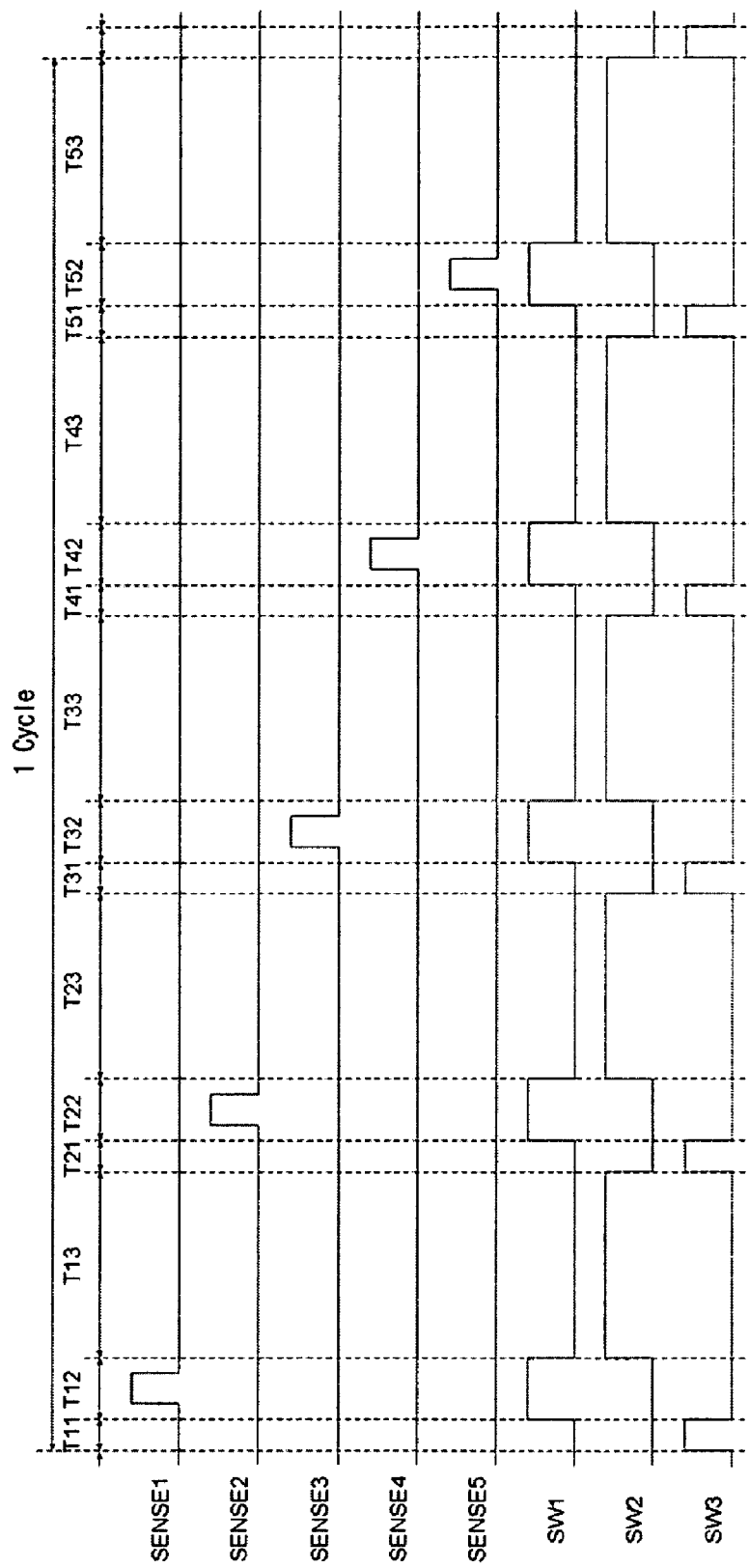
FIG. 4 is a timing diagram showing control signals applied to a cell voltage measurer of FIG. 3.

In FIG. 4, the on-voltage of the control signals SENSE1 to SENSE5, SW1, SW2, and SW3 is shown as a high level voltage and the off-voltage thereof is shown as a low level voltage.

The voltage of the charging unit 130 is discharged during a period T11 because the switch of the discharging unit 150 is turned on in response to on-voltage of the control signal SW3 while the relays 111 to 115, the cell voltage transmitting unit 120, and the charging voltage transmitting unit 140 are turned off. During a period T12, the cell voltage transmitting unit 120 and the relay 111 are turned on and the charging voltage transmitting unit 140 and the switches of the discharging unit 150 are turned off in response to the on-voltage of the control signals SW1 and SENSE1 and the off-voltage of the control signals SW2, SW3. The charging unit 130 is then charged to the voltage of the battery cell 21a by the relay 111 and the cell voltage transmitting unit 120. The period T12 is proportional to a time constant determined by a capacitance of the charging unit 130 and a parasitic resistance formed between the battery cell 21a and the charging unit 130.

During a period T13, in response to the off-voltage of the control signal SENSE1, the relay 111 is turned off and thus the battery cell 21a and the cell voltage transmitting unit 120 are electrically disconnected. In addition, in response to the off-voltage of the control signal SW1 and the on-voltage of the control signal SW2, the cell voltage transmitting unit 120 is turned off and the charging voltage transmitting unit 140 is turned on. The voltage of the battery cell 21a charged to the charging unit 130 is then transmitted through the buffer 160 and the analog/digital converter 400 to the controller 300. Accordingly, the controller 300 may sense the voltage of the battery cell 21a.

A time in which the voltage of the battery cell 21a is transmitted to the controller 300 is determined by a time for transmitting the voltage of the charging unit 130 through the charging voltage transmitting unit 140 and a time for the analog/digital converter 400 to process the voltage.

During a period T21, in response to the on-voltage of the control signal SW3, the switch of the discharging unit 150 is turned on such that the voltage of the battery cell 21a charged to the charging unit 130 during the period T12 is discharged. During a period T22, in response to the on-voltage of the control signals SW1, SENSE2 and the off-voltage of the control signals SW2, SW3, the cell voltage transmitting unit 120 and the relay 112 are turned on and the switches of the charging voltage transmitting unit 140 and the discharging unit 150 are turned off. The voltage of the battery cell 21b is then charged to the charging unit 130 by the relay 112 and the cell voltage transmitting unit 120.

Next, during a period T23, in response to the off-voltage of the control signal SENSE2, the relay 112 is turned off. In addition, in response to the off-voltage of the control signal SW1 and the on-voltage of the control signal SW2, the voltage of the battery cell 21b charged by the charging unit 130 is transmitted through the buffer 160 and the analog/digital converter 400 to the controller 300.

Likewise, during a period T31, the switch of the discharging unit 150 is turned on such that the voltage of the battery cell 21b charged by the charging unit 130 during the period T22 is discharged. During a period T32, in response to the on-voltage of the control signals SW1, SENSE3 and the off-voltage of the control signals SW2, SW3, the voltage of the battery cell 21c is charged to the charging unit 130. In addition, during a period T33, in response to the off-voltage of the control signals SENSE3 and SW1 and the on-voltage of the control signal SW2, the voltage of the battery cell 21c charged by the charging unit 130 is transmitted to the controller 300.

Likewise, periods T41, T42, T43, T51, T52, T53 are sequentially performed, and accordingly, the controller 300 may sense the voltages of the battery cells 21d, 21e. In more detail, during the respective periods T41, T51, the switches of the discharging unit 150 are turned on, and accordingly, the voltages of the battery cells 21c, 21d charged by the charging unit 130 during the respective periods T32, T42 are discharged. During the respective periods T42, T52, in response to the on-voltage of the control signals SW1, SENSE4, SENSE5 and the off-voltage of the control signals SW2, SW3, the voltages of the battery cells 21d, 21e are charged by the charging unit 130. During the respective periods T43, T53, in response to the off-voltage of the control signals SW1, SENSE4, SENSE5 and the on-voltage of the control signals SW2, the voltages of the battery cells 21d, 21e charged by the charging unit 130 are transmitted to the controller 300.

As such, the battery management system 10 according to the first exemplary embodiment of the present invention, during one cycle from the period T11 to the period T53, the voltages of the plurality of battery cells 21a to 21e of the cell group 21 may be sensed by the one cell voltage measurer 100. In addition, the battery management system 10 may measure the voltages of the plurality of battery cells of the respective cell groups 22 to 28 by the cell voltage measurer 100 coupled to the other cell groups 22 to 28 in the same manner during this period. The battery management system 10 may continuously manage the voltages of the plurality of battery cells by repeating the cycle from the period T11 to the period T53.

However, according to the first exemplary embodiment of the present invention, the charging unit 130 is discharged before the voltages of the respective battery cells 21a to 21e are charged. The periods T11, T21, T31, T41, T51 for discharging the voltages of the charging unit 130 are proportional to the time constant determined by the capacitor of the charging unit 130 and the resistance of discharging unit 150. If the voltage of the battery cell is again at the charging unit 130 after the voltage of the charging unit 130 is discharged, a significant amount of charges are to be charged.

Accordingly, the periods T12, T22, T32, T42, T52 for charging the voltages to the charging unit 130 become longer, and also, the periods T11, T21, T31, T41, T51 for discharging the voltages from the charging unit 130 are required. Since the cycle for measuring the voltages of the plurality of battery cells becomes longer due to such increased time, an interval between sensing of the voltage of the battery cell and a subsequent sensing thereof becomes longer. Therefore, it may not cope with a problem generated at the battery cell during this interval. Hereinafter, a method for decreasing the cycle of the voltage of the battery cell will be described with reference to FIG. 5 and FIG. 6.

Figure 5:
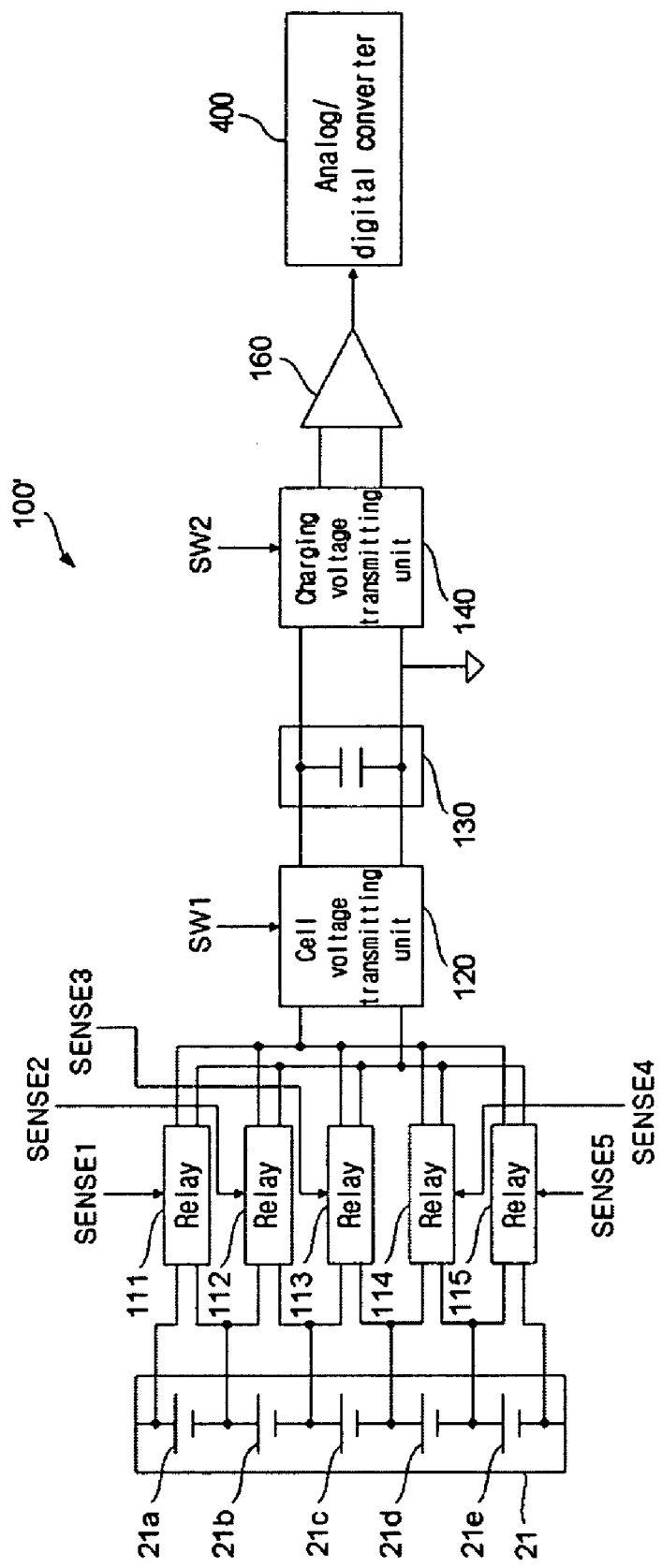
FIG. 5 schematically illustrates a battery management system according to a second exemplary embodiment of the present invention.
Figure 6:
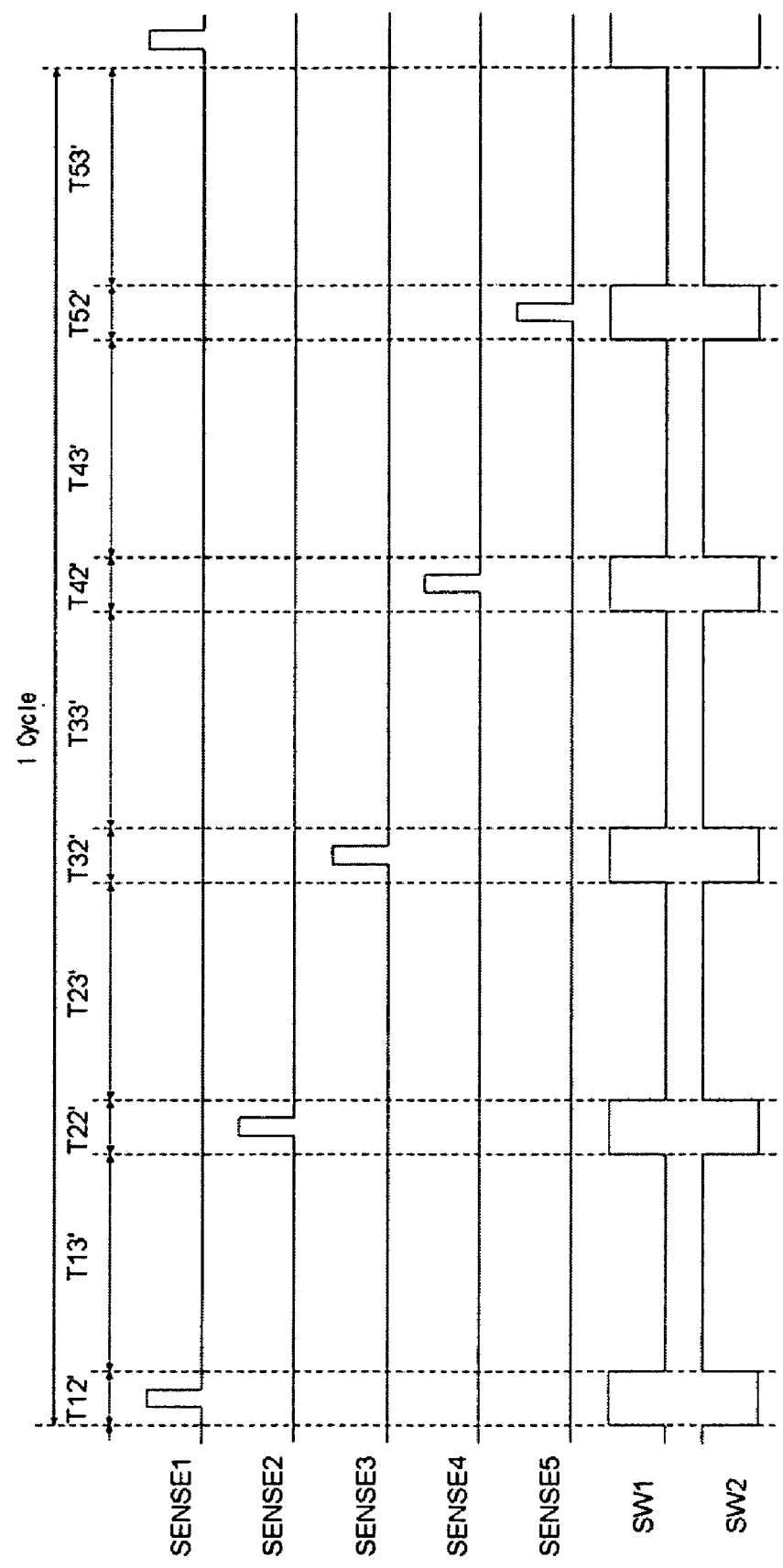
FIG. 6 is a timing diagram showing control signals applied to a cell voltage measurer of FIG. 5.

FIG. 5 schematically illustrates a battery management system according to a second exemplary embodiment of the present invention, and FIG. 6 is a timing diagram showing a control signal applied to a cell voltage measurer of FIG. 5.

As shown in FIG. 5, a cell voltage measurer 100' according to a second exemplary embodiment of the present invention has a structure excluding the discharging unit 150 from the cell voltage measurer 100 of FIG. 3. As shown in the timing diagram of FIG. 6, the periods T11, T21, T31, T41, T51 for discharging the voltages of the charging unit 130 are not performed.

In more detail, during a time period T12', in response to the on-voltage of the control signals SW1, SENSE1 and the off-voltage of the control signal SW2, the cell voltage transmitting unit 120 and the relay 111 are turned on and the switches of the charging voltage transmitting unit 140 are turned off. The voltage of the battery cell 21a is then charged to the charging unit 130 by the relay 111 and the cell voltage transmitting unit 120. The battery cell 21a may be assumed to be a capacitor of a large capacitance, the voltage of the charging unit 130 coupled in parallel to the battery cell 21a being the same as that of the battery cell 21a regardless of the immediately previous voltage of the charging unit 130.

Next, during a period T13', in response to the off-voltage of the control signals SENSE1, SW1 and the on-voltage of the control signal SW2, the relay 111 and the cell voltage transmitting unit 120 are turned off and the charging voltage transmitting unit 140 is turned on. The voltage of the battery cell 21a charged by the charging unit 130 is then transmitted through the buffer 160 and the analog/digital converter 400 to the controller 300.

Next, during a period T22', in response to the on-voltage of the control signals SW1, SENSE2 and the off-voltage of the control signal SW2, the relay 112 and the cell voltage transmitting unit 120 are turned on and the charging voltage transmitting unit 140 is turned off. The voltage of the battery cell 21b is then charged to the charging unit 130 by the relay 112 and the cell voltage transmitting unit 120. As described above, since the battery cell 21b may be assumed to be a capacitor of a large capacitance, the voltage of the charging unit 130 may be the same as that of the battery cell 21b regardless of the voltage charged to the charging unit 130 during the period T2'. Since the charging unit 130 is again charged, while a voltage corresponding to the voltage of the battery cell 21a is held in the charging unit 130, the voltage of the battery cell 21b may be rapidly charged to the charging unit 130. That is, the period T22' may be set to be shorter than the period T22 of FIG. 4.

Likewise, during the respective periods T32', T42', T52', the voltages of the battery cells 21c, 21d, 21e are charged to the charging unit 130, while voltages corresponding to the voltage of the battery cells 21b, 21c, 21d are held in the charging unit 130. During the respective periods T33', T43', T53', the respective voltages of the battery cells 21c, 21d, 21e charged to the charging unit 130 are transmitted to the controller 300. In this case, since the battery cells 21c, 21d, 21e may be assumed to be capacitors of a large capacitance, the voltages of the battery cells 21c, 21d, 21e may be rapidly charged to the charging unit 130 during the respective periods T33', T43', T53'.

According to the second exemplary embodiment of the present invention, the voltage of the battery cell just previously charged by the charging unit 130 may not be discharged, but the voltage of the desired battery cell may be charged to the charging unit 130, and accordingly, the time for discharging the charging unit 130 may be removed. Since a battery cell is charged by the charging unit 130 that is already charged with a voltage corresponding to the battery cell, the time for charging the battery cell may be reduced in comparison with the case that the charging unit 130 is charged after being discharged.

As described above, according to the first and second exemplary embodiments of the present invention, the battery management system may separately have the control signal generator 200 and the controller 300. However, the controller 300 may include the control signal generator 200. That is, the controller 300 may generate the control signals SENSE1 to SENSE5 and SW1 to SW3.

In addition, according to the first and second exemplary embodiments of the present invention, all the relays 111 to 115, 120, 140 may include a switch for electrically connecting or disconnecting two input terminals and two output terminals in response to the control signals.

In addition, according to the first and second exemplary embodiments of the present invention, the control signal generator 200 may separately generate the control signals SW1, SW2 for controlling the cell voltage transmitting unit 120 and the charging voltage transmitting unit 140. However, it may generate only one of the two control signals SW1, SW2.

Figure 7:
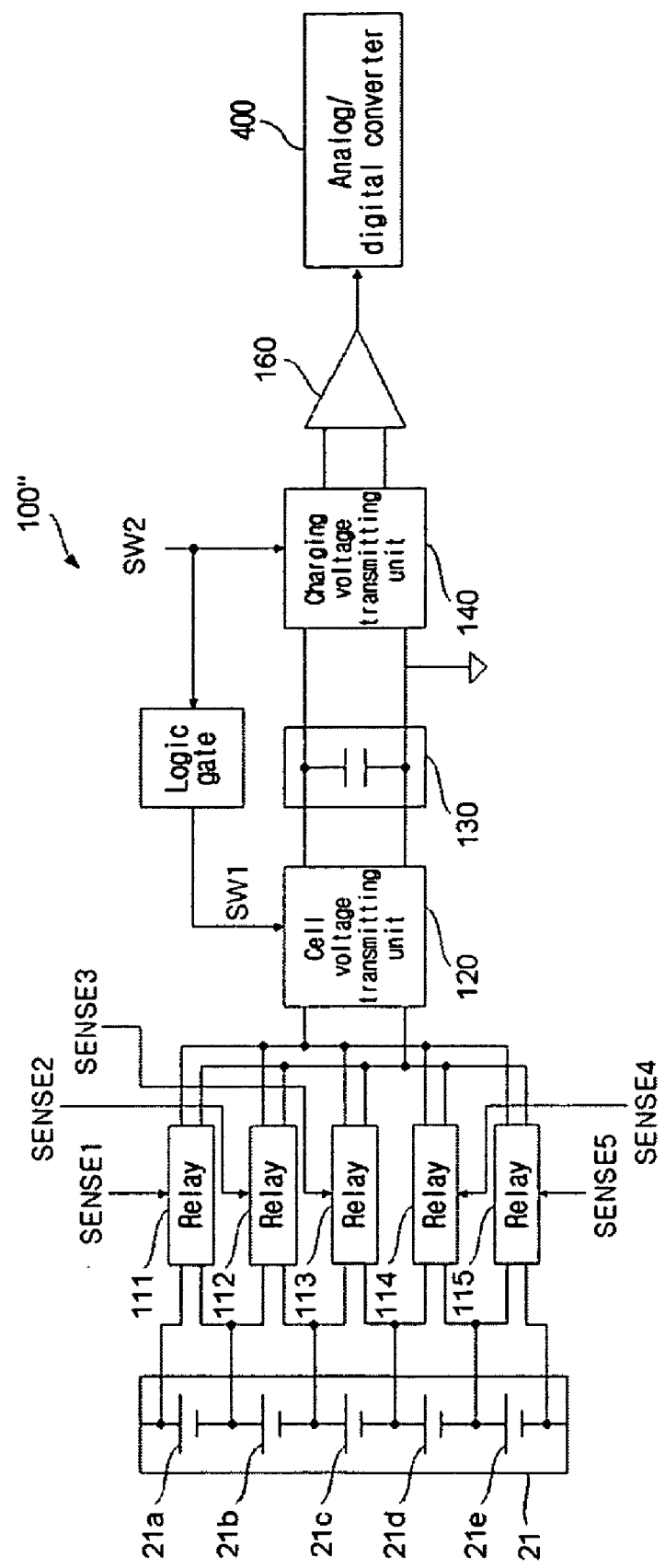
FIG. 7 schematically illustrates a cell voltage measurer according to a third exemplary embodiment of the present invention.

FIG. 7 schematically illustrates a cell voltage measurer according to a third exemplary embodiment of the present invention.

As shown in FIG. 7, a cell voltage measurer 100'' according to a third exemplary embodiment of the present invention further includes a logic circuit 170 unlike the cell voltage measurer 100' of FIG. 5.

As shown in FIG. 6, the control signal SW1 for controlling the cell voltage transmitting unit 120 and the control signal SW2 for controlling the charging voltage transmitting unit 140 have an inverse level. Accordingly, the control signal SW1 is generated at the logic circuit 170 by inverting the control signal SW2 received from the control signal generator 200 (see FIG. 2), instead of being directly output from the control signal generator 200. An inverter may be used as such a logic circuit 170. Also, a NAND gate receiving the control signal SW2 as two inputs may be used.

Unlike FIG. 7, the signal generator 200 (see FIG. 2) may not output the control signal SW2, but the logic circuit 170 may inverse the control signal SW1 from the control signal generator 200 (see FIG. 2) and thus generate the control signal SW2.

As described above, according to the first to third exemplary embodiments of the present invention, the battery management system 10 and the battery 20 may be described with respect to the battery system 1. However, the system 1 may include other structures for managing the battery 20. Hereinafter, such exemplary embodiments are described with reference to FIG. 8 and FIG. 9.

Figure 8:
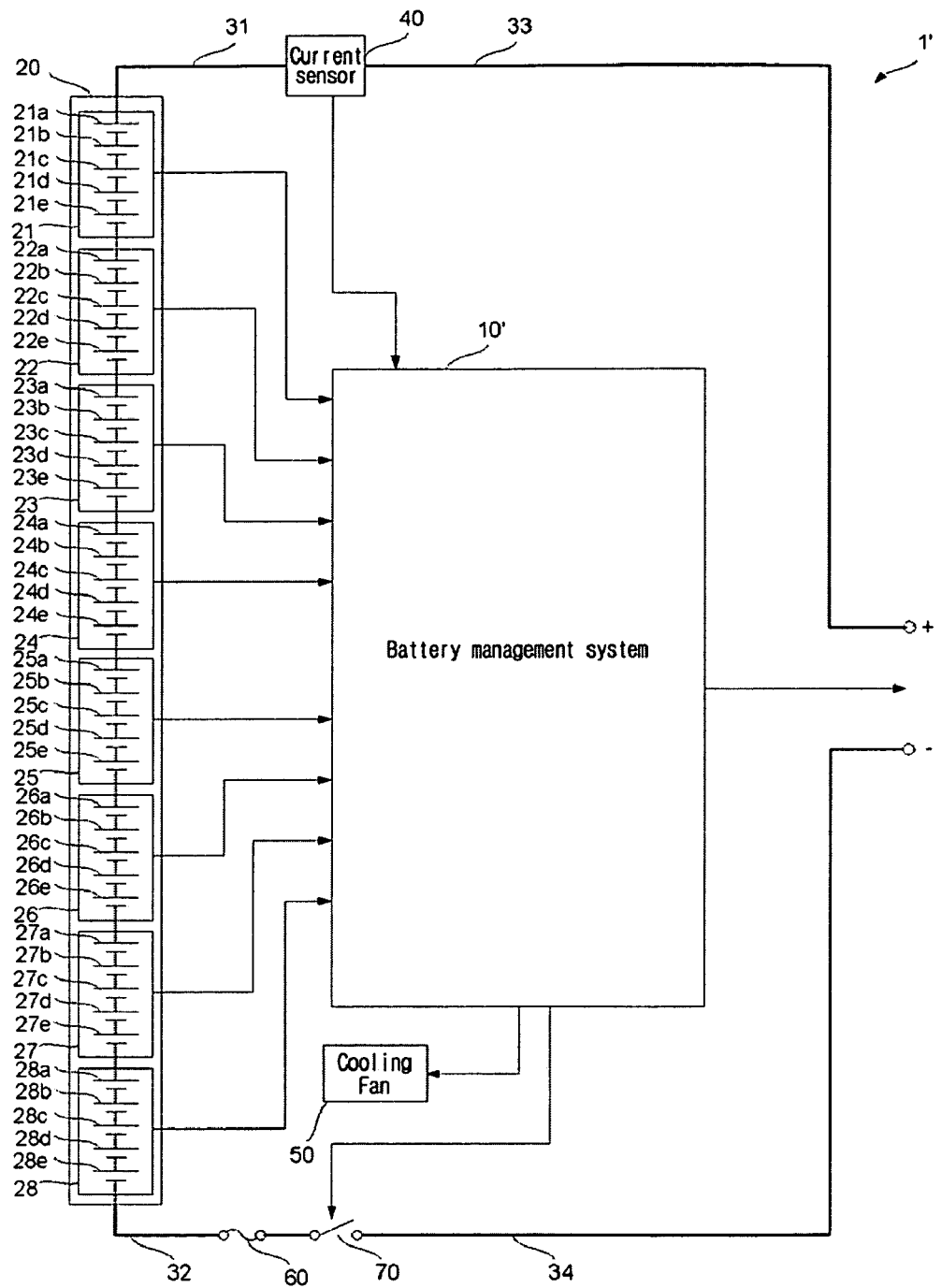
FIG. 8 schematically illustrates a battery system according to a fourth exemplary embodiment of the present invention.
Figure 9:
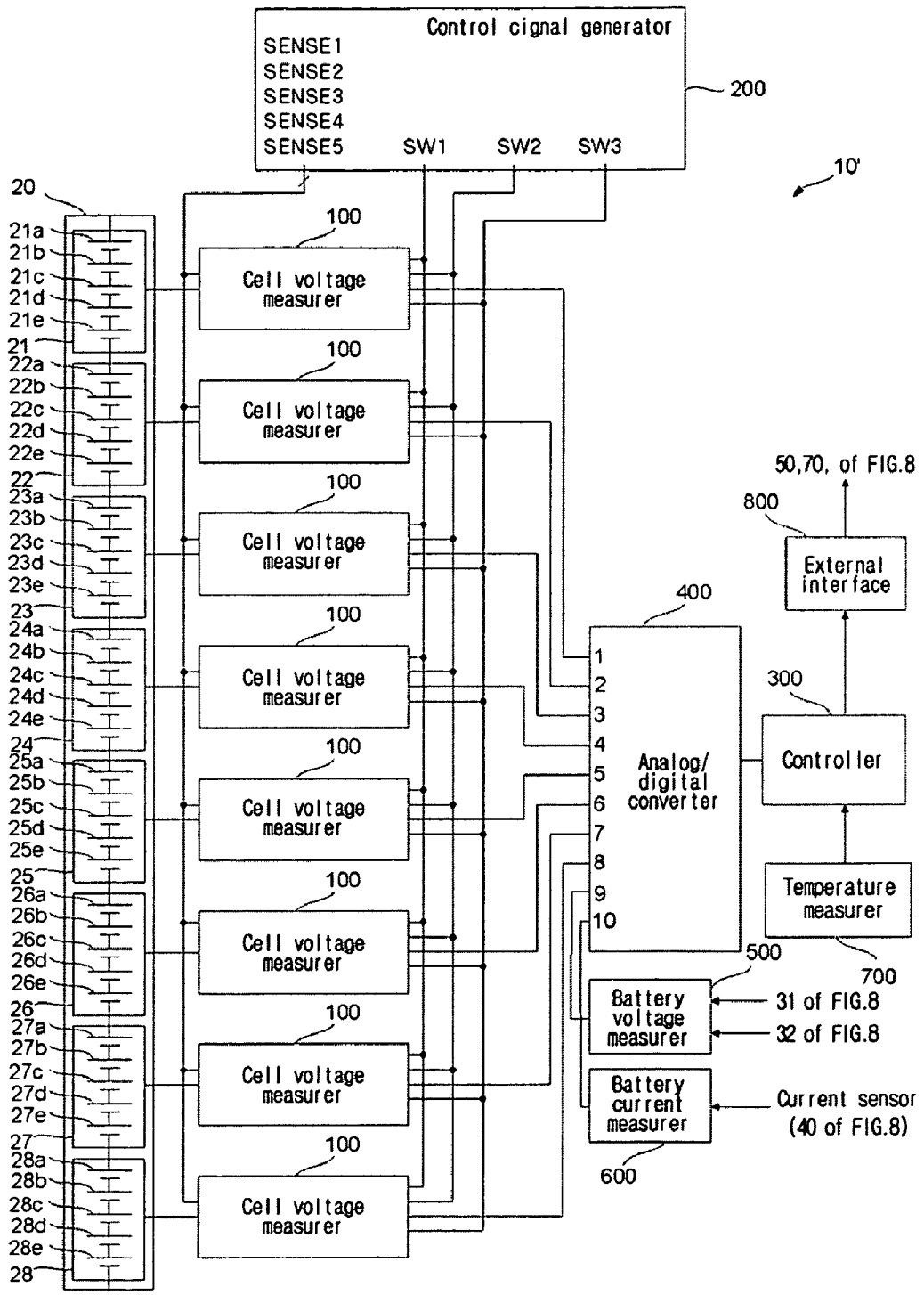
FIG. 9 schematically illustrates a battery management system of FIG. 8.

FIG. 8 schematically illustrates a battery system according to a fourth exemplary embodiment of the present invention and FIG. 9 schematically illustrates a battery management system of FIG. 8.

As shown in FIG. 8, a battery system 1' according to a fourth exemplary embodiment includes at least one of a current sensor 40, a cooling fan 50, a fuse 60, and a main switch 70 as well as the battery management system 10' and the battery 20. FIG. 8 illustrates the battery system 1' including all of the following components: current sensor 40, cooling pan 50, fuse 60, and main switch 70.

Referring to FIG. 9, the battery management system 10' of FIG. 8 includes at least one of a battery voltage measurer 500, a battery current measurer 600, a temperature measurer 700, and an external interface 800 as well as the cell voltage measurer 100, the control signal generator 200, the controller 300, and the analog/digital converter 400. FIG. 9 illustrates the battery management system 10' including all of the following components: battery voltage measurer 500, battery current measurer 600, temperature measurer 700, and external interface 800.

The current sensor 40 is electrically connected between an anode input terminal 33 of a power generator and the anode output terminal 31 of the battery 20 and measures an output current of the battery 20, and transmits the measured current value to the battery management system 10'. The current sensor 40 may be coupled between the cathode input terminal 34 of the power generator and the cathode output terminal 32 of the battery 20.

The cooling fan 50 cools heat generated by the charging/discharging of the battery 20 according to the control signal of the battery management system 10'. The fuse 60 is coupled between the cathode input terminal 34 of the power generator and the cathode output terminal 32 of the battery 20, and accordingly prevents the transmission of over-current to the power generating apparatus when the overcurrent is generated in the battery 20. The main switch 70 is coupled between the cathode input terminal 34 of the power generator and the cathode output terminal 32 of the battery 20, and accordingly intercepts a current path along to the control signal of the battery management system 10' when an abnormal phenomenon such as an over-voltage, over-current, and a high temperature, occurs. The fuse 60 and the main switch 70 may also be coupled between the anode input terminal 33 of the power generator and the anode output terminal 31 of the battery 20.

The battery voltage measurer 500 of the battery management system 10' measures a battery voltage between the anode output terminal 31 and the cathode input terminal 32 and transmits the measured value to the analog/digital converter 400. The battery current measurer 600 receives the measured battery current from the current sensor 30 and transmits it to the analog/digital converter 400. The analog/digital converter 400 converts each of the battery voltage and the battery current into digital signals and transmits the converted values to the controller 300. The temperature measurer 700 measures internal and peripheral temperatures of the battery 20 and transmits the measured digital value to the controller 300. In this manner, the controller 300 may entirely manage the voltage, current, and temperature of the battery 20.

In addition, the controller 300 may control operations of the cooling fan 50 and the main switch 70 through the external interface 800 according to the voltage, current, and temperature of the battery 20.

Figure 10:
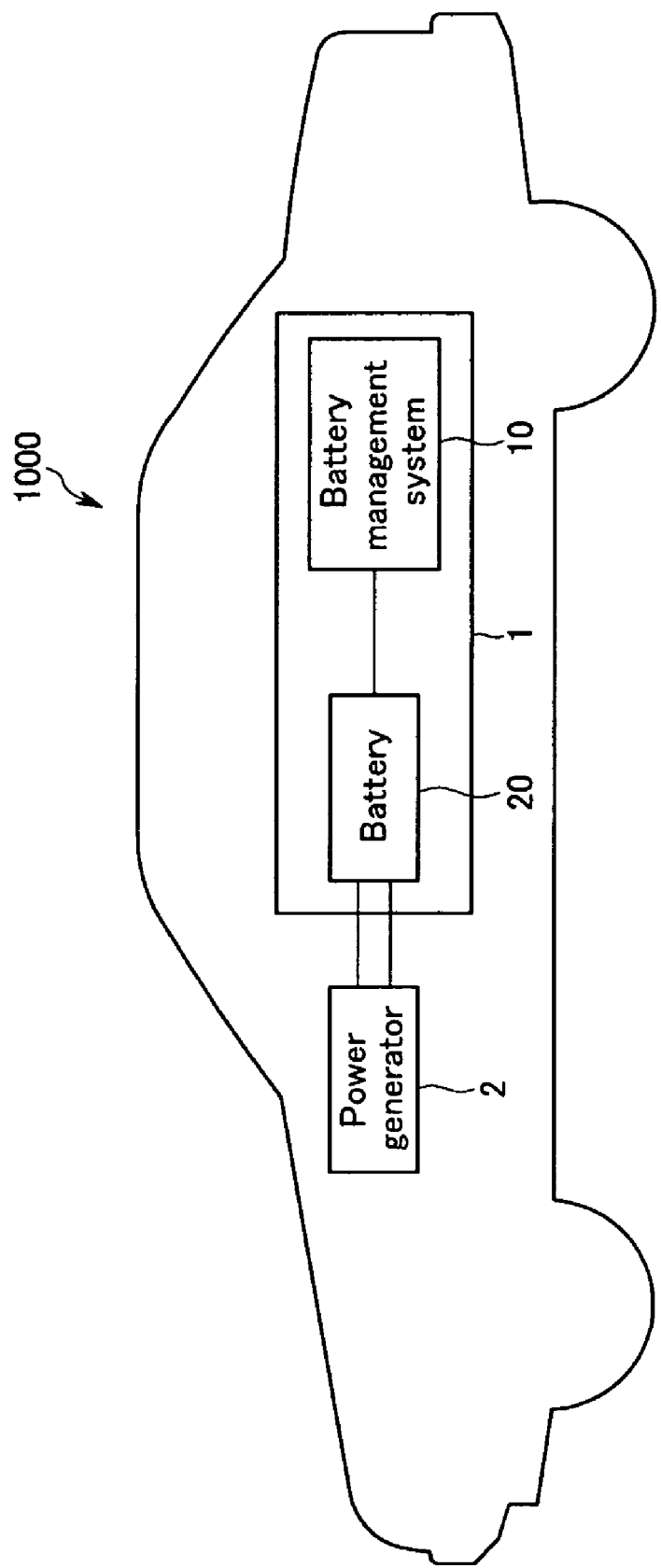
FIG. 10 is a schematic block diagram of a vehicle according to an exemplary embodiment of the present invention.

As shown in FIG. 10, when a power generator 2 operated by electrical energy of the battery 20 of the battery systems 1, 1' according to exemplary embodiments of the present invention is installed in a vehicle 1000, an effective battery vehicle or a hybrid vehicle can result.

According to an exemplary embodiment of the present invention, the voltages of the plurality of battery cells may be measured by a single charging unit, and thus, the number of charging units may be decreased. In addition, since the voltage of the previously charged battery cell may not be discharged, but the voltage of the new battery cell may be charged by the charging unit, a time for charging may be decreased or the period for discharging the charging unit may be removed. Accordingly, the cycle for measuring the voltage of the battery cell may be decreased. In addition, according to an exemplary embodiment of the present invention, the voltage, current, and temperature, or the like, of the battery are measured, and thus, the operation of the battery may be managed according to the state thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A system for managing a battery having a plurality of battery cells coupled in series, the plurality of battery cells including at least a first battery cell and a second battery cell adjacent to the first battery cell, the system comprising:

a first relay having first relay input terminals and first relay output terminals, the first relay input terminals configured to be respectively coupled to a first battery cell anode and to a first battery cell cathode, the first relay being configured to operate in response to a first control signal;

a second relay having second relay input terminals and second relay output terminals, the second relay input terminals configured to be respectively coupled to a second battery cell anode and to a second battery cell cathode, the second relay being configured to operate in response to a second control signal;

a first voltage transmitting unit having first voltage transmitting unit input terminals and first voltage transmitting unit output terminals, the first voltage transmitting unit input terminals being respectively coupled to the first relay output terminals and to the second relay output terminals, the first voltage transmitting unit being configured to output a voltage from the first voltage transmitting unit input terminals through the first voltage transmitting unit output terminals in response to an on-voltage of a single third control signal, and to electrically disconnect the first voltage transmitting unit input terminals from the first voltage transmitting unit output terminals in response to an off-voltage of the third control signal;

a charging unit comprising a single capacitor having two capacitor input terminals, and a charging unit output terminal, the capacitor input terminals being respectively connected to the first voltage transmitting unit output terminals, the charging unit being configured to be charged to a voltage from the first voltage transmitting unit output terminals;

a second voltage transmitting unit having a second voltage transmitting unit input terminal and a second voltage transmitting unit output terminal, the second voltage transmitting unit input terminal being coupled to the charging unit output terminal, the second voltage transmitting unit being configured to output the voltage of the charging unit in response to an on-voltage of a fourth control signal; and a control signal generator configured to:
set the voltage of the charging unit as a voltage of the second battery cell by setting the second control signal as an on-voltage while the voltage of the charging unit corresponds to a voltage of the first battery cell;
separately assert the first and second control signals synchronously to the on-voltage of the third control signal before respectively measuring the voltage of the first battery cell and the voltage of the second battery cell; and
set the first, second, and third control signals as an off-voltage while measuring the voltage of the first battery cell and the voltage of the second battery cell, wherein the charging unit is configured to be charged to the voltage of the first battery cell and to the voltage of the second battery cell as voltages having a same polarity, and wherein voltages of different battery cells from among the plurality of battery cells are measured on consecutive assertions of the third control signal.

2. The system of claim 1, wherein the control signal generator is further configured to:
set the first control signal and the third control signal as an on-voltage and the second control signal and the fourth control signal as an off-voltage during a first period;
set the fourth control signal as an on-voltage and the first control signal, the second signal, and the third control signal as an off-voltage during a second period following the first period;
set the second control signal and the third control signal as an on-voltage and the first control signal and the fourth control signal as an off-voltage during a third period following the second period; and
set the fourth control signal as an on-voltage, and the first control signal, the second control signal, and the third control signal as an off-voltage during a fourth period following the third period.

3. The system of claim 1, wherein the first voltage transmitting unit and the second voltage transmitting unit each includes a relay.

4. The system of claim 1, wherein the fourth control signal has an inverse voltage with respect to the third control signal.

5. The system of claim 4, further comprising a logic circuit configured to output the fourth control signal by inversing the third control signal.

6. The system of claim 4, further comprising a logic circuit configured to output the third control signal by inversing the fourth control signal.

7. The system of claim 1, further comprising:
an analog/digital converter configured to convert an output voltage of the second voltage transmitting unit into a digital signal; and
a controller configured to measure voltages of the first battery cell and the second battery cell by using the digital signal from the analog/digital converter.

8. The system of claim 7, further comprising a buffer configured to transmit the output voltage of the second voltage transmitting unit to the analog/digital converter.

9. The system of claim 7, wherein the controller includes the control signal generator, the controller thus generating the first control signal, the second control signal, the third control signal, and the fourth control signal.

10. A method of managing a battery having a plurality of battery cells coupled in series, the plurality of battery cells including a first battery cell and a second battery cell adjacent to the first battery cell, the method comprising:
charging a single capacitor having two terminals with a first battery cell voltage to a first capacitor voltage having a first polarity in response to an on-voltage of a first control signal for operating a first relay, an off-voltage of a second control signal for operating a second relay, and an on-voltage of a third control signal for operating a third relay, the first relay having first relay input terminals and first relay output terminals, the first relay input terminals respectively coupled to an anode and a cathode of the first battery cell, the second relay having second relay input terminals and second relay output terminals, the second relay input terminals respectively coupled to an anode and a cathode of the second battery cell, the third relay having third relay input terminals and third relay output terminals, the third relay input terminals respectively coupled to the first relay output terminals and the second relay output terminals, and the third relay output terminals respectively connected to the terminals of the capacitor;
measuring the first battery cell voltage using the first capacitor voltage in response to an off-voltage of the third control signal to electrically disconnect the third relay input terminals from the third relay output terminals;
charging the capacitor with a second battery cell voltage to a second capacitor voltage having the first polarity while the capacitor is charged with the first capacitor voltage having the same first polarity in response to an off-voltage of the first control signal, an on-voltage of the second control signal, and the on-voltage of the third control signal, to replace the first capacitor voltage with the second capacitor voltage; and
measuring the second battery cell voltage using the second capacitor voltage in response to the off-voltage of the third control signal,
wherein consecutive measurements of battery cell voltages are from different battery cells from among the plurality of battery cells.

11. The method of claim 10, wherein measuring the first battery cell voltage and the second battery cell voltage comprises:
outputting a capacitor voltage charged to the capacitor to a buffer;
converting a buffer output voltage into a digital signal; and
measuring the capacitor voltage using the converted digital signal.

12. The method of claim 11,
wherein the charging the capacitor with the first battery cell voltage includes:
turning off a fourth relay coupled between the capacitor and the buffer; and
turning on the first relay while the fourth relay is turned off, and
wherein the charging the capacitor with the second battery cell voltage under a condition that the capacitor is charged with the first battery cell voltage includes:
turning off the fourth relay; and
turning on the second relay while the fourth relay is turned off.

13. The method of claim 12,
wherein the measuring the first battery cell voltage using the first capacitor voltage includes:
turning off the first relay; and
turning on the fourth relay while the first relay is turned off, and wherein the measuring the second battery cell voltage using the second capacitor voltage includes:
turning off the second relay; and
turning on the fourth relay while the second relay is turned off.

14. The method of claim 12, wherein the turning off the fourth relay comprises turning on the third relay.

15. A system for managing a battery having a plurality of battery cells, the plurality of battery cells being divided into a plurality of cell groups, the system comprising:
a plurality of cell voltage measurers respectively coupled to the plurality of cell groups;
an analog/digital converter configured to convert voltages measured by the plurality of cell voltage measurers into digital signals; and
a controller configured to control charging and discharging of the plurality of battery cells included in each of the cell groups according to the digital signals converted by the analog/digital converter,
wherein each of the cell voltage measurers includes a single capacitor having two terminals, and is configured to:
charge a voltage of a first battery cell among the plurality of battery cells of a corresponding one of the cell groups to the capacitor as a first capacitor voltage having a first polarity in response to an on-voltage of a first control signal for operating a first relay, an off-voltage of a second control signal for operating a second relay, and an on-voltage of a third control signal for operating a third relay, the first relay having first relay input terminals and first relay output terminals, the first relay input terminals respectively coupled to an anode and a cathode of the first battery cell, the second relay having second relay input terminals and second relay output terminals, the second relay input terminals respectively coupled to an anode and a cathode of a second battery cell adjacent to the first battery cell among the plurality of battery cells of the corresponding one of the cell groups, the third relay having third relay input terminals and third relay output terminals, the third relay input terminals respectively coupled to the first relay output terminals and the second relay output terminals, and the third relay output terminals respectively connected to the terminals of the capacitor;
transmit the first capacitor voltage to the analog/digital converter in response to an off-voltage of the third control signal to electrically disconnect the third relay input terminals from the third relay output terminals;
charge a voltage of the second battery cell to the capacitor as a second capacitor voltage having the first polarity while the first capacitor voltage having the same first polarity is held in the capacitor in response to an off-voltage of the first control signal, an on-voltage of the second control signal, and the on-voltage of the third control signal, to replace the first capacitor voltage with the second capacitor voltage; and
transmit the second capacitor voltage to the analog/digital converter in response to the off-voltage of the third control signal,
wherein consecutive transmissions to the analog/digital converter of voltages charged to the capacitor are voltages charged to the capacitor by different battery cells from among the plurality of battery cells.

16. The system of claim 15, wherein each of the cell voltage measurers further includes a buffer configured to transmit the first capacitor voltage and the second capacitor voltage to the analog/digital converter.

17. The system of claim 15, further comprising a cell voltage measurer configured to measure a voltage between an anode output terminal of the battery and a cathode output terminal of the battery and transmit the measured voltage to the analog/digital converter.

18. The system of claim 15, further comprising:
a current sensor configured to measure a current flowing through the plurality of battery cells; and
a cell current measurer configured to transmit a measured current to the analog/digital converter.

19. The system of claim 15, further comprising a temperature measurer configured to measure a temperature of the battery or a temperature of the periphery of the battery, and transmit a measured temperature to the controller.

20. A battery system comprising:
a battery having a plurality of battery cells coupled in series, the plurality of battery cells including a first battery cell and a second battery cell adjacent to the first battery cell; and
a battery management system,
wherein the battery management system includes a cell voltage measurer configured to:
charge a single capacitor having two terminals by the first battery cell with a first battery voltage to a first capacitor voltage having a first polarity in response to an on-voltage of a first control signal for operating a first relay, an off-voltage of a second control signal for operating a second relay, and an on-voltage of a third control signal for operating a third relay, the first relay having first relay input terminals and first relay output terminals, the first relay input terminals respectively coupled to an anode and a cathode of the first battery cell, the second relay having second relay input terminals and second relay output terminals, the second relay input terminals respectively coupled to an anode and a cathode of the second battery cell, the third relay having third relay input terminals and third relay output terminals, the third relay input terminals respectively coupled to the first relay output terminals and the second relay output terminals, and the third relay output terminals respectively connected to the terminals of the capacitor;
measure the first battery voltage from the capacitor in response to an off-voltage of the third control signal to electrically disconnect the third relay input terminals from the third relay output terminals;
charge the capacitor by the second battery cell with a second battery voltage to a second capacitor voltage having the first polarity while the capacitor holds the first capacitor voltage having the same first polarity in response to an off-voltage of the first control signal, an on-voltage of the second control signal, and the on-voltage of the third control signal, to replace the first capacitor voltage with the second capacitor voltage; and
measure the second battery voltage from the capacitor in response to the off-voltage of the third control signal,
wherein consecutive measurements of battery cell voltages from the capacitor are from different battery cells from among the plurality of battery cells.

21. The battery system of claim 20, further comprising:
an analog/digital converter configured to convert the capacitor voltage into a digital signal; and a controller configured to measure a converted digital signal.

22. The battery system of claim 21, wherein the cell voltage measurer comprise
a fourth relay having input terminals coupled to the terminals of the capacitor, the fourth relay being configured to transmit the first or the second capacitor voltage to the analog/digital converter in response to a fourth control signal.

23. The battery system of claim 21, further comprising a current sensor configured to sense a current flowing through the battery, and
wherein the battery management system further includes:
a battery current measurer configured to measure a current sensed by the current sensor and to transmit a measured current through the analog/digital converter to the controller;
a battery voltage measurer configured to measure a voltage between terminals of the battery, and to transmit a measured voltage through the analog/digital converter to the controller; and
a temperature measurer configured to measure a temperature of the battery or a temperature of a periphery of the battery.

24. The battery system of claim 21, further comprising:
a cooling fan controlled by the controller; and
a main switch coupled to a terminal of the battery and controlled by the controller.

25. The battery system of claim 21, further comprising a fuse coupled to a terminal of the battery.

26. The battery system of claim 20, wherein electrical energy is transmitted from the battery of the battery management system to operate a power generator of a vehicle.

* * * * *

UNITED STATES PATENT AND TRADEMARK OFFICE
CERTIFICATE OF CORRECTION

| | | |
|---|---|---|
| PATENT NO. | : 8,004,249 B2 | Page 1 of 1 |
| APPLICATION NO. | : 11/643219 | |
| DATED | : August 23, 2011 | |
| INVENTOR(S) | : Gye-Jong Lim et al. | |

It is certified that error appears in the above-identified patent and that said Letters Patent is hereby corrected as shown below:

Column 15, Claim 22, line 4        Delete "comprise" Insert -- comprises --

Signed and Sealed this
Fifth Day of June, 2012

David J. Kappos
*Director of the United States Patent and Trademark Office*